United States Patent

Wei et al.

[11] Patent Number: 5,835,986
[45] Date of Patent: Nov. 10, 1998

[54] ELECTROSTATIC DISCHARGE (ESD) STRUCTURE AND BUFFER DRIVER STRUCTURE FOR PROVIDING ESD AND LATCHUP PROTECTION FOR INTEGRATED CIRCUIT STRUCTURES IN MINIMIZED I/O SPACE

[75] Inventors: Hua-Fang Wei, Sunnyvale; Ashok K. Kapoor, Palo Alto, both of Calif.

[73] Assignee: LSI Logic Corporation, Milpitas, Calif.

[21] Appl. No.: 708,258

[22] Filed: Sep. 6, 1996

[51] Int. Cl.[6] .................................................. H01L 23/62
[52] U.S. Cl. ........................ 257/360; 257/355; 257/356; 257/357; 257/362
[58] Field of Search .................................. 257/355, 360, 257/361, 362, 356, 357, 368

[56] References Cited

U.S. PATENT DOCUMENTS

| | | | |
|---|---|---|---|
| 3,748,187 | 7/1973 | Aubuchon et al. | 257/368 |
| 5,465,189 | 11/1995 | Polgreen et al. | 257/357 |
| 5,535,084 | 7/1996 | Nakayama | 257/356 |

*Primary Examiner*—Steven H. Loke
*Attorney, Agent, or Firm*—John P. Taylor

[57] ABSTRACT

Described is an portion of an integrated circuit structure formed on a semiconductor substrate which provides electrostatic discharge (ESD) protection, utilizing an SCR structure, and also inhibits latchup of the SCR structure. The integrated circuit structure comprises an ESD protection device and an adjoining driver section matched together so that the width dimension of the ESD protection device matches the sum of the length of the adjacent driver section plus twice the width of a doped portion of the substrate forming a guard ring surrounding the driver section. When the length dimension of the MOS structure of the driver section is so maximized by further repeating of the source/gate/drain regions, the physical width dimension of the MOS structure of the driver section may be reduced without reducing the effective width of the MOS structure of the driver section, i.e., the effective width of the MOS structure remains sufficient to permit the required amount of power to be handled by the driver section. By matching the width of the ESD device to the sum of the length of the driver section and the width of the surrounding guard ring, latchup of the SCR structure in the ESD protection device may be inhibited or eliminated, since any charges injected into the substrate from outer source regions in the MOS structure of the driver section and passing through the guard ring region will not impact against the width dimension of the ESD protection device. At the same time, such matching of the width of the ESD protection device to the total length of the MOS structure of the driver section and the width of the guard ring permits the overall size or footprint of the driver section to be reduced by reduction of the physical width of the MOS structure of the driver section without reduction of the effective width of the MOS structure of the driver section, so that the driver section is still capable of handling the required input or output power.

7 Claims, 4 Drawing Sheets

5,835,986

ELECTROSTATIC DISCHARGE (ESD) STRUCTURE AND BUFFER DRIVER STRUCTURE FOR PROVIDING ESD AND LATCHUP PROTECTION FOR INTEGRATED CIRCUIT STRUCTURES IN MINIMIZED I/O SPACE

BACKGROUND OF THE INVENTION

1. Field of the Invention

This invention relates to an integrated circuit structure formed on a semiconductor substrate. More particularly, this invention relates to providing electrostatic discharge (ESD) protection for integrated circuit structures, as well as protection against latchup of the ESD protection device by charges injected into the substrate by the adjacent buffer structure, while minimizing the substrate area occupied by the ESD protection device and the adjacent buffer structure.

2. Description of the Related Art

It is important to prevent damage, caused by electrostatic discharge (ESD), to gate oxides at input buffers and to MOS components at bidirectional buffers and output drivers. To prevent such damage, an on-chip ESD protection device may be provided. Such an ESD protection device, however, must be triggerable and release a built-up charge at a voltage substantially below the breakdown voltages for the gate oxides and MOS components.

Some prior art structures have been proposed to provide ESD protection. However, at least in some cases, such protective circuitry require the low voltage triggering of structures which include a parasitic lateral NPN transistor and a linked parasitic vertical PNP transistor. However, this can also cause voltage latchup to occur in the CMOS structure being protected against ESD damage. Such voltage latchup is unacceptable and alternate means for providing ESD protection have, therefore, been explored.

In a related application entitled "ESD PROTECTION FOR DEEP SUBMICRON CMOS DEVICES WITH MINIMUM TRADEOFF FOR LATCHUP BEHAVIOR", previously filed by us on Nov. 13, 1995, as U.S. patent application Ser. No. 08/556,599, assigned to the assignee of this invention, and the disclosure of which is hereby incorporated by reference herein, an ESD protection device containing an SCR structure was disclosed and claimed to provide ESD protection to an integrated circuit structure. This ESD protection device is generally shown at 2 in FIG. 1. ESD protection device 2 provides a tunable low voltage-triggering SCR structure in which triggering occurs at voltages in the range of 5–20 volts.

In the structure of the aforementioned Serial No. 08/556,599, as shown in FIG. 1, ESD protection device 2 comprises a P doped substrate 3 provided with a P+ contact region 4 which provides an electrical contact to substrate 3. An N+ source region 6, also formed in substrate 3, is separated from P+ contact region 4 by a first field oxide region 8. N+ source region 6 comprises the source for the MOSFET of the SCR structure which provides the ESD protection. An N well 10 is also provided in substrate 3 and has a P+ emitter region 12 formed therein as well as an N+ contact region 14 formed therein, with N+ contact region 14 serving as an electrical contact to N well 10. P+ emitter region 12 and N+ contact region 14 are separated from one another by a second field oxide region 16. At the edge of N well 10 and shown in physical and electrical contact with N well 10 is an N+ floating drain region 18 which serves as the drain for the MOSFET of the SCR structure. Floating drain region 18 further serves as the base of the lateral parasitic PNP bipolar transistor. N+ floating drain region 18 is separated from P+ emitter region 12 by a third field oxide region 20.

In the illustrated embodiment, a gate oxide layer 22 is formed on the surface of substrate 3 between N+ source contact region 6 and N+ floating drain region 18, with a polysilicon gate electrode 24 formed over gate oxide 22. A channel region 26 lies in substrate 3 beneath gate oxide layer 22.

P+ contact region 4, N+ source region 6, and gate electrode 24 are electrically connected together by a first electrically conductive bus member 28 which is, in turn, electrically connected to ground, e.g., a Vss bus. First electrically conductive member 28 may comprise one or more doped polysilicon layers or one or more metal layers, or a combination thereof as is well known to those skilled in the art of forming electrical busses for integrated circuit structures. P+ emitter region 12 and N+ contact region 14 are electrically connected together by a second electrically conductive bus member 30, e.g., a Vdd power bus, to a portion of the integrated circuit structure to be protected against damage by ESD, such as for example, an input/output (I/O) pin.

FIG. 2 illustrates an electrical schematic of ESD protection device 2, as just described and shown in FIG. 1, including the SCR and associated lateral and vertical parasitic bipolar transistors and resistances in ESD protection device 2, to provide ESD protection to portions of an integrated circuit structure such as the I/O buffer circuits. Resistors R1 and R2 each represent resistances through substrate 3 (R2 could represent the resistance through a P well, if P+ contact region 4, N+ source region 6, and floating drain region 18 were formed in a P well instead of a P type substrate), while resistance R3 represents the resistance through N well 10. Node points N1, N2, and N3 respectively correspond to first P+ contact region 4, N+ source region 6, and gate electrode 24 in FIG. 1, while nodes N4 and N5 respectively correspond to P+ emitter region 12 and N+ contact region 14 in FIG. 1. MOSFET transistor T1 in FIG. 2 corresponds to source region 6, gate oxide layer 22, gate electrode 24, and floating drain region 18 in FIG. 1. Lateral transistors T2 and T3 in FIG. 2 comprises the parasitic bipolar transistors formed between emitter region 12, P+ contact 4 (which serves as the collector for transistors T2 and T3), and floating drain region 18 (which serves as the base for transistors T2 and T3) in FIG. 1.

While the just discussed ESD protection device described and claimed in Ser. No. 08/556,599, is effective to provide the desired ESD protection, the NPNP construction of the SCR structure in ESD protection device 2 also makes this SCR structure susceptible to latchup.

Latchup may be defined as a high current flow through the semiconductor substrate (rather than along or adjacent the substrate surface) between the Vdd power bus and the Vss ground bus. Such high current flow may be initiated by a power surge or glitch, or it may be caused by the design of a particular circuit. The NPNP construction of the SCR structure in the previously discussed ESD protection device falls into the latter category. This type of latchup can occur due to injection of a charge (positive or negative) into the substrate from an I/O driver positioned on the substrate adjacent the ESD protection device which includes the SCR structure. Referring to FIG. 3, the latchup problem related to the above-described SCR structure is illustrated. As shown in FIG. 3, electrons are injected into substrate 3 from outer source regions 42 and 44 of an N driver structure 40 shown positioned adjacent ESD protection device 2 which includes the SCR structure. It will be noted that the injected electrons, as they drift toward ESD protection device 2, will impact the side of ESD protection device 2, not the end. In other words, the side of ESD protection device 2 is broad sided by the electrons being injected into the substrate. This is due in part to both the size and the disposition of ESD protection device 2 on substrate 3 relative to the size and disposition of the CMOS structure of the I/O driver. ESD protection device 2 containing the SCR structure which provides the desired ESD protection, is positioned sideways to the CMOS structure of N driver 40. That is, the width of ESD protection device 2 runs with and faces the length of the CMOS structure in N driver section 40, while the length of the ESD protection device 2 is in a direction parallel to the physical width of the CMOS structure in N driver section 40, as illustrated in FIG. 3. The "length" is used in connection with the devices, i.e. ESD protection device 2 and N driver 40, to define the direction in which current flows between the source regions and drain regions of the respective SCR and MOS structures; while the term "width" is used in connection with the devices to define the direction of the particular MOSFET perpendicular to the current flow in the channel. The terms "physical length" and "physical width" are intended to define the actual amount of space in either the length or width dimension taken up by the respective SCR or MOS structures comprising the I/O structure. The term "effective width", which is sometimes used in connection with the MOS structure, is intended to mean the physical width of the MOS structure time the number of repeating source/gate/drain regions or "fingers" repeated along the physical length of the MOS structure. It will be noted that the physical length and width of the SCR structure (which is not a repeating structure) is the same as the effective length and width of the SCR structure.

As shown in FIG. 3, when the width of the SCR structure in ESD protection device 2 exceeds the physical length of the CMOS structure facing it, comprising adjacent driver section 40, charges from outer source regions 42 and 44 of the CMOS structure of driver 40 (electrons from N drivers or positive charges from P drivers) can drift toward P+ contact region 4 of the SCR structure in ESD protection device 2 and impact the side of this region, causing latchup in the SCR structure.

To inhibit this flow of charges injected into substrate 3 by outer source regions 42 and 44 of the CMOS structure of driver section 40, a guard ring 50 may be provided around driver section 40. For an N driver with NMOS structures, wherein electrons are injected into substrate 2 from outer source regions 42 and 44, guard ring 50 will comprise a P+ guard ring comprising a P+ doped region of substrate 3 which encircles N type I/O driver 40, as illustrated in FIG. 3. The function of P+ guard ring 50 is to inhibit flow, beyond guard ring 50, of such electrons injected into substrate 3.

While such a guard ring is at least partially effective in inhibiting or repelling such electron flow into the substrate, not all of the injected electrons are turned back, as shown in FIG. 3. When some of the electrons pass through P+ guard ring 50, at least a portion of such electrons are then directed toward the SCR structure of ESD protection device 2, because of the larger size of the SCR in the width direction (compared to the physical length of the MOS structure), resulting in an increased possibility of latchup of the SCR structure.

To remedy this, it has been proposed to increase the dimensions of P+ guard ring 50 sufficiently to match the width dimension of the SCR structure, as shown by guard ring 50' in FIG. 4. As illustrated, when and if electrons, injected into the substrate from source regions 42 and 44, do pass through guard ring structure 50', such electrons passing through the P+ doped region comprising guard ring 50' will already be beyond the width dimension of the SCR structure of ESD device 2. Such electrons, if they do impact on the SCR structure, will contact the end edges of the various electrodes comprising the SCR structure, i.e., will impact a much smaller cross-sectional area of any one component of the SCR, and thus will be much less likely to result in a latchup of the SCR.

However, while such an enlarged guard ring structure is effective in inhibiting latchup in the SCR structure of ESD protection device 2 caused by injected charges (electrons or holes) from the adjacent driver section 40, it will be noted that an unacceptably large area of substrate 3 will be taken up by such an enlarged guard ring 50'. Since there is an ongoing effort in integrated circuit technology to shrink the sizes of all components of an integrated circuit structure without compromising the desired performance of the structure, it would be desirable to solve the problem of latchup, in an ESD protection device containing an SCR structure, from charges injected into the substrate from an adjacent driver section without, however, unduly enlarging the area occupied by the protective guard ring encircling the driver section.

SUMMARY OF THE INVENTION

It is, therefore an object of the invention to provide an integrated circuit structure on a semiconductor substrate comprising an ESD protection device and an adjoining driver section matched to one another whereby the width dimension of the ESD protection structure matches the sum of the physical length of the adjacent driver section (the total number of source/gate/drain regions or "fingers") plus twice the width of the P+ guard ring surrounding the driver section. When the physical length dimension of the MOS structure of the driver section is so maximized, the physical width dimension of the MOS structure of the driver section (see FIG. 1) may be reduced (thus reducing the total area of the I/O section) without changing the effective width of the MOS structure (because of the added number of repeating source/gate/drain regions or "fingers"), so that the total current carrying capacity of the MOS structure remains unchanged while the physical width of the MOS driver section is reduced, thus reducing the overall area of the I/O section of the integrated circuit structure.

By matching the width of the ESD device to the sum of the physical length of the MOS driver section and the width of the surrounding guard ring, latchup of the SCR structure in the ESD protection device may be inhibited or eliminated, since any charges injected into the substrate from outer source regions in the MOS structure of the driver section and passing through the guard ring region will not impact against the width dimension of the ESD protection device. At the same time, such matching of the width of the ESD protection device to the total of the physical length of the MOS structure of the driver section plus twice the width of the guard ring permits the overall size or footprint of the driver section to be either maintained or reduced by reduction of the physical width of the MOS structure of the driver section down to the minimum effective width of the MOS structure of the driver section capable of handling the required input or output power.

DETAILED DESCRIPTION OF THE INVENTION

Figure 4:
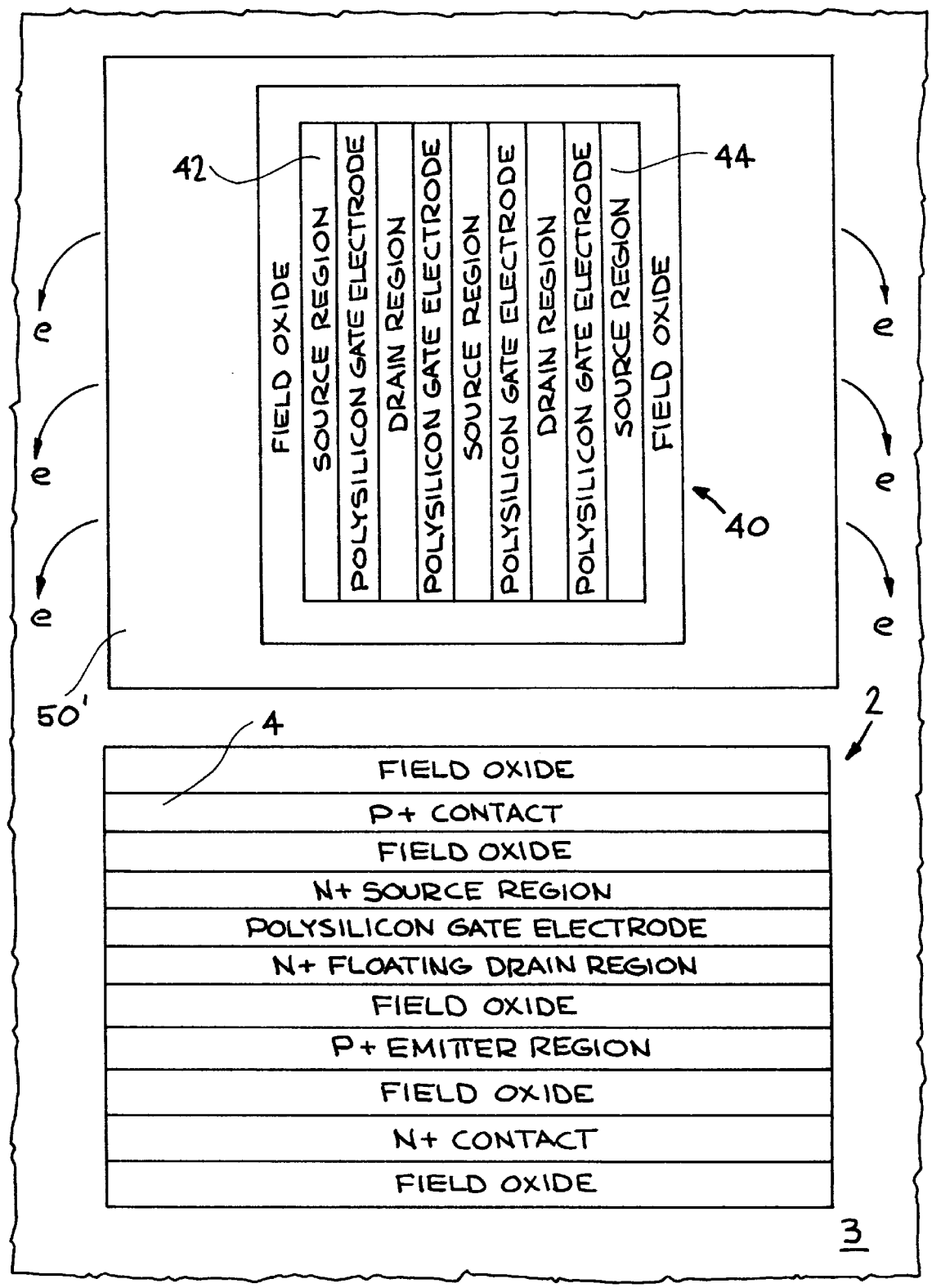
FIG. 4 is a top view of the ESD protection device of FIG. 1 shown with an N driver section of the same dimensions as in FIG. 3, but with a surrounding P+ guard ring having an enlarged length so that the outer dimension of the P+ guard ring in the length dimension matches the facing width of the ESD protection device so that electrons, injected into the substrate from the outer source regions of the N driver device, which pass through the P+ guard ring structure will not impact against the width dimension of the ESD device.

Turning now to FIG. 4, in one embodiment, the latchup problem may be remedied by increasing the dimensions of P+ guard ring 50 sufficiently to match the width dimension of the SCR structure, as shown by guard ring 50' in FIG. 4. As illustrated, when and if electrons, injected into the substrate from source regions 42 and 44, do pass through guard ring structure 50', such electrons passing through the P+ doped region comprising guard ring 50' will already be beyond the width dimension of the SCR structure of ESD device 2. Such electrons, if they do impact on the SCR structure, will contact the end edges of the various electrodes comprising the SCR structure, i.e., will impact a much smaller cross-sectional area of any one component of the SCR and thus will be much less likely to result in a latchup of the SCR.

However, while such an enlarged guard ring structure is effective in inhibiting latchup in the SCR structure of ESD protection device 2 caused by injected charges (electrons or holes) from the adjacent driver section 40, it will be noted that an unacceptably large area of substrate 3 will be taken up by such an enlarged guard ring 50'. Since there is an ongoing effort in integrated circuit technology to shrink the sizes of all components of an integrated circuit structure without compromising the desired performance of the structure, it would be desirable to solve the problem of latchup, in an ESD protection device containing an SCR structure, from charges injected into the substrate from an adjacent driver section without, however, unduly enlarging the area occupied by the protective guard ring encircling the driver section.

Figure 5:
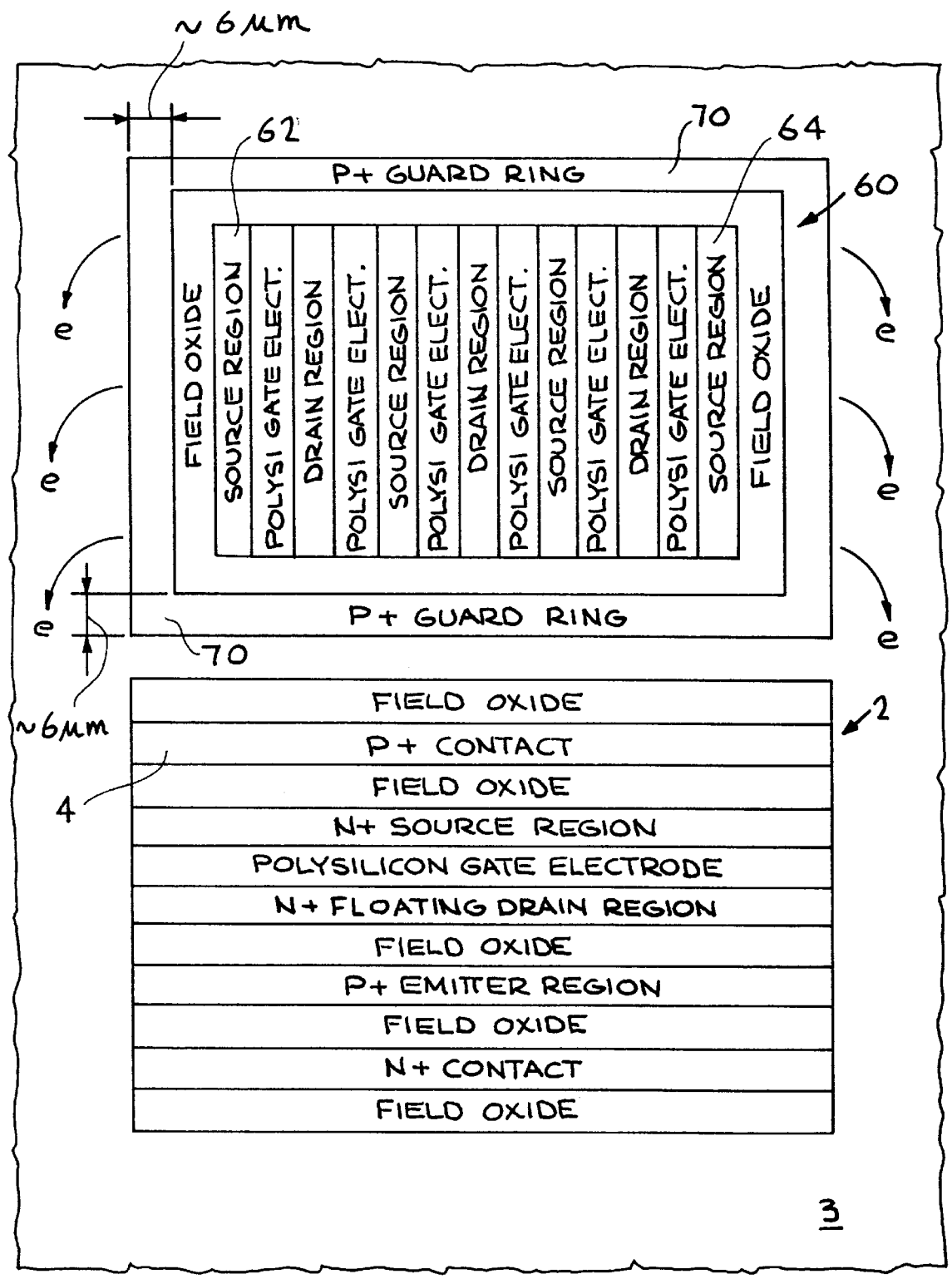
FIG. 5 is a top view of the ESD protection device of FIG. 1 shown with the adjacent N driver section enlarged in the length dimension and reduced in the width dimension so that the length times width of the CMOS portions remain the same as in the embodiment of FIG. 4, and with a surrounding P+ guard ring having an outer dimension of the P+ guard ring in the length dimension which matches the facing width of the ESD protection device so that electrons, injected into the substrate from the outer source regions of the N driver device, which pass through the P+ guard ring structure, will not impact against the width dimension of the ESD device.

Therefore, in the preferred embodiment of the invention, as illustrated in FIG. 5, the MOS structure comprising the driver section is altered to increase the number of source/gate/drain regions of the MOS structure, thus increasing the physical length of MOS driver section 60 compared to driver section 40 of FIG. 4. At the same time the physical width of driver section 60 (and outer source regions 62 and 64 therein) is decreased (without decreasing the effective width of MOS section 60), in comparison to the physical width of driver section 40 (and outer source regions 42 and 44 therein) of FIG. 4, resulting in an effective width of the MOS structure of driver section 60 equaling the elective width of the MOS structure of driver section 40, while occupying less physical width.

Figure 1:
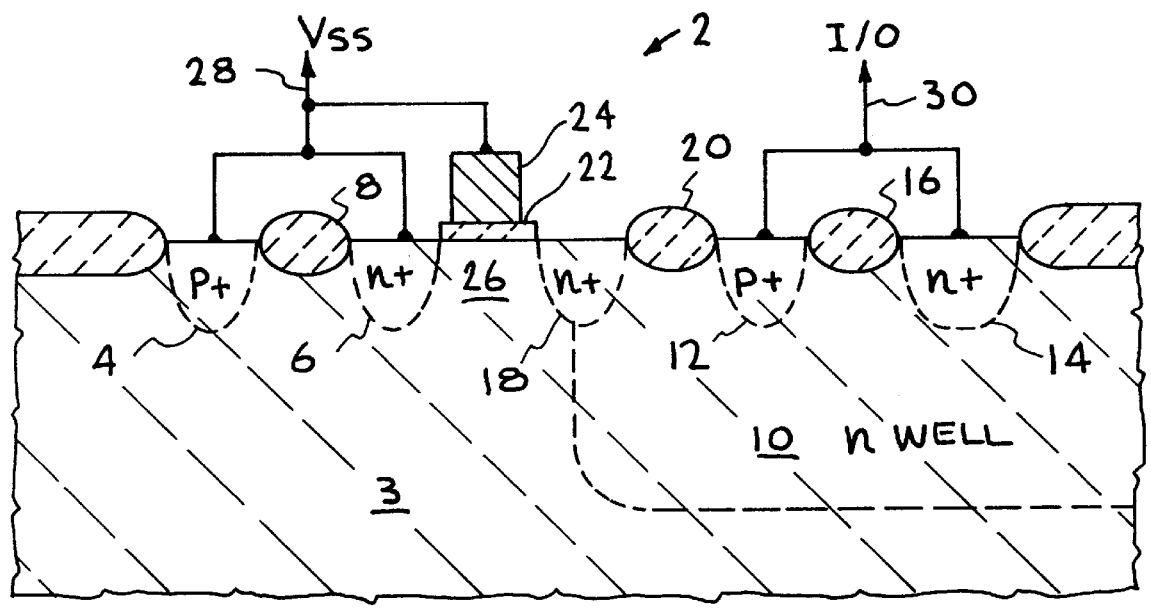
FIG. 1 is a fragmentary vertical side section view of the ESD protection device described and claimed in Ser. No. 08/556,599.
Figure 2:
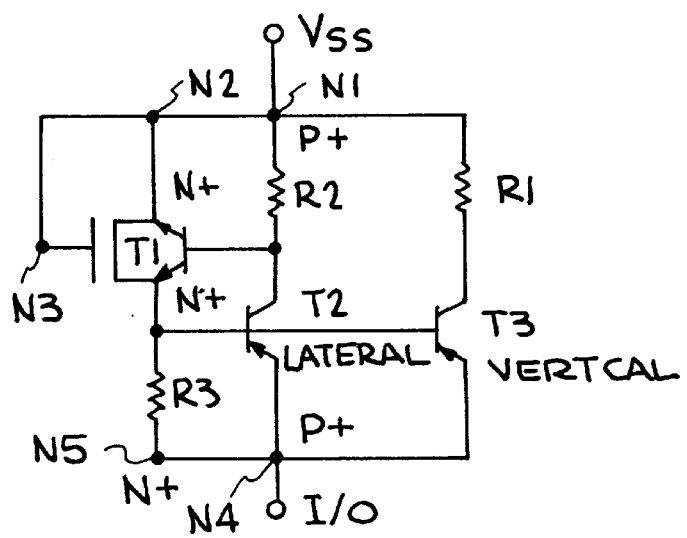
FIG. 2 is a schematic view of the electrical circuitry defined by the ESD protection structure shown in FIG. 1.
Figure 3:
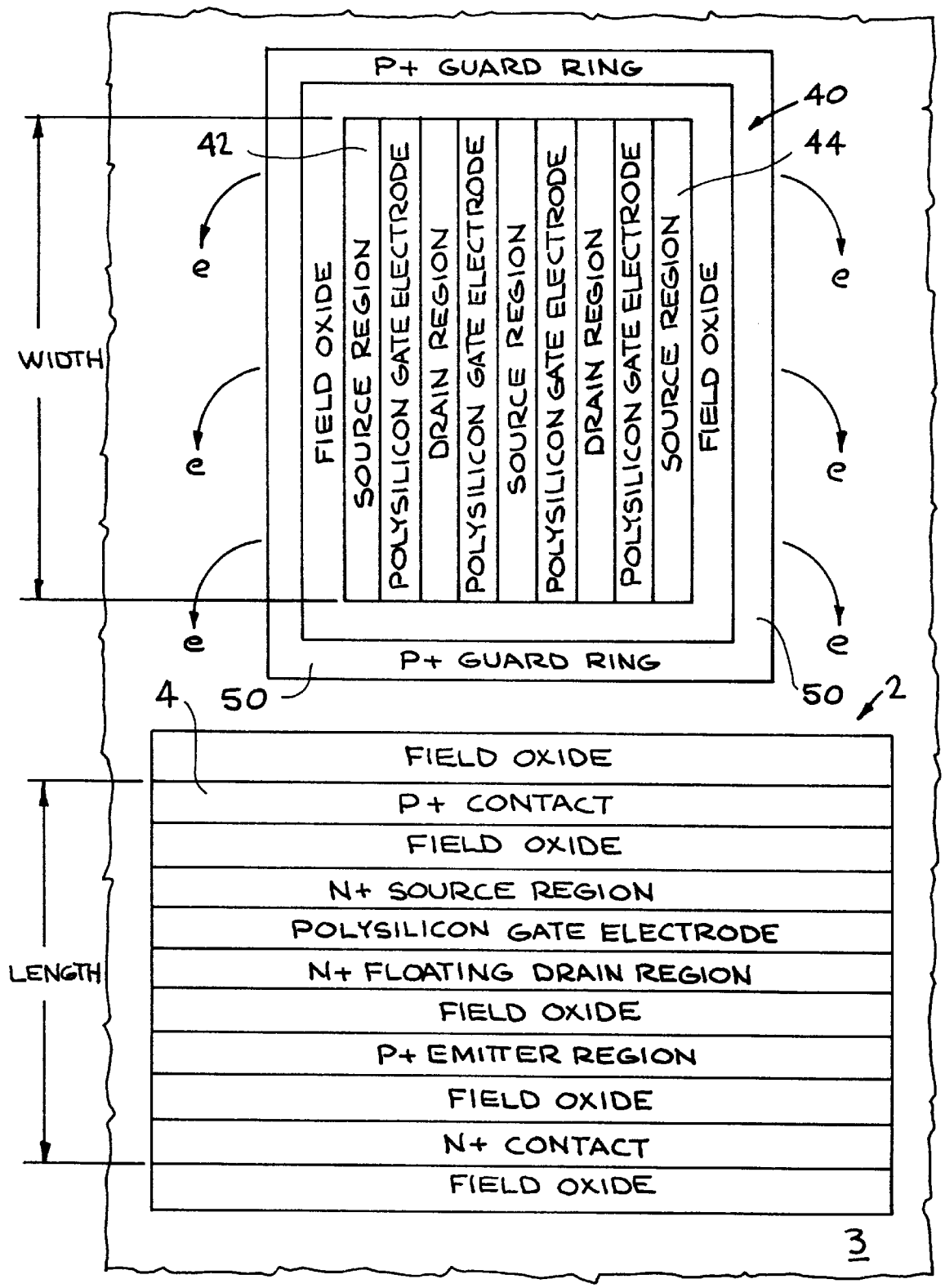
FIG. 3 is a top view of the ESD protection device of FIG. 1 shown with an N driver section and surrounding P+ guard ring having a smaller total length than the facing width of the ESD protection device.

As will be noted in FIG. 5, the width of guard ring 70 surrounding driver section 60 is the same as that shown for guard ring 50 surrounding driver section 40 in FIG. 3. However, in FIG. 5, the MOS structure length of driver section 60 has been increased sufficiently so that the sum of the widths of guard ring 70 (at each end), plus the physical length of the enlarged MOS structure in driver section 70 will equal the width of ESD (SCR) section 2.

The result is that the latchup problem in the ESD protection device has been solved while minimizing the overall area taken up by the sum of the ESD protection device and the adjoining driver section, i.e., minimizing the overall I/O area, by increasing the physical length of the MOS structure in the driver section while decreasing the physical width of the MOS structure (without decreasing the effective width of the MOS structure because of the added number of "fingers" of source/gate/drain regions made possible by the increase in physical length of the MOS structure).

The width of guard ring 70, comprising the implanted region of the substrate surrounding the driver section, will range from about 4 micrometers ($\mu$m) to about 8 $\mu$m, preferably from about 5 $\mu$m to about 7 $\mu$m, and typically will be about 6 $\mu$m in width, as shown in FIG. 5. Thus the length of the MOS structure in driver section 60 adjacent ESD protection device 2 having the SCR structure therein will equal the width of ESD protection device 2 minus twice the width of guard ring 70 or:

Length of MOS structure=Width of ESD device−2X

Where X (the width of the guard ring) ranges from about 4 $\mu$m to about 8 $\mu$m.

Thus, for an ESD protection device (SCR) having a length of about 20–30 $\mu$m and a width of about 38–64 $\mu$m, and capable of providing sufficient protection to an integrated circuit structure to dissipate the energy or power from an electrostatic discharge of 2 kV from a human body (a human body model or HBM zapping), with a protective guard ring width of about 6 $\mu$m, the dimensions of the NMOS driver section should be about 300 $\mu$m of total effective NMOS width with a physical length of the MOS driver section equal to the width of the SCR device minus the space occupied by twice the width of the guard ring.

Thus, the latchup of the ESD protection device is inhibited or prevented while minimizing the overall area taken up by the sum of the area of the ESD protection device and the area of the adjoining driver section (the total I/O area) by increasing the physical length of the MOS structure in the driver section and decreasing the physical width of the MOS structure in the driver section, while the effective width of the MOS structure in the driver section remains the same. The latchup problem is inhibited or eliminated by maintaining the sum of the physical length of the MOS structure of the driver section and twice the width of the guard ring equal to the width of the ESD (SCR) protection device so that any charges (electrons for N drivers or holes for P drivers) injected into the substrate by the outer source regions of the MOS structure in the driver section and passing through the doped region comprising the guard ring will not impact on the width dimension of any component of the SCR structure in the ESD protection device.

Having thus described the invention what is claimed is:

1. An integrated circuit structure formed on a semiconductor substrate and capable of providing protection against electrostatic discharge (ESD) and protection against latchup by the structure used to provide said ESD protection comprising:
   a) an ESD protection device;
   b) an adjoining driver section which comprises an MOS structure comprising a series of source regions and drain regions wherein each source region is separated from a drain region by a gate electrode formed on said semiconductor substrate and a channel region in said substrate formed below said gate electrode, said driver section having a length dimension facing a width dimension of said ESD protection device; and
   c) a guard ring and a field oxide surrounding said source and drain regions and said gate electrode comprising said driver section;
   wherein said width of said ESD protection device equals the sum of said length of said adjoining driver section plus twice the width of said guard ring and twice the width of said field oxide.

2. The integrated circuit structure of claim 1 wherein said guard ring has a width ranging from about 4 $\mu$m to about 8 $\mu$m.

3. The integrated circuit structure of claim 2 wherein said guard ring has a width ranging from about 5 $\mu$m to about 7 m.

4. The integrated circuit structure of claim 2 wherein said ESD protection device comprises an SCR structure having a P+ or N+ active source region and a P+ or N+ active drain region having a conductivity type similar to said source region.

5. The integrated circuit structure if claim 1 wherein said ESD protection device comprises:
   a) a semiconductor substrate of a first conductivity type;
   b) a main well of a second conductivity type formed in said substrate;
   c) a doped source region and a doped drain region of said second conductivity type formed in said substrates, and a channel region formed in said substrate between said source and drain regions and beneath a gate oxide and a gate electrode thereon, said drain region formed contiguous with said main well; and
   d) a doped emitter region of said first conductivity type formed in said well of said second conductivity type, said doped emitter region separated from said doped drain region by an isolation oxide region.

6. An integrated circuit structure formed on a semiconductor substrate of a first conductivity type and capable of providing protection against electrostatic discharge (ESD) and protection against latchup by the structure used to provide said ESD protection comprising:
   a) an ESD protection device comprising:
      i) a main well of a second conductivity type formed in said semiconductor substrate of said first conductivity type;
      ii) a doped source region and a doped drain region of said second conductivity type formed in said substrate, and a channel region formed in said substrate between said source region and said drain region and beneath a gate oxide and a gate electrode thereon, said drain region formed contiguous with said main well; and
      iii) a doped emitter region of said first conductivity type formed in said well of said second conductivity type, said doped emitter region separated from said doped drain region by an isolation oxide region;
   b) an adjoining driver section having a length dimension facing a width dimension of said ESD protection device, said adjoining driver section comprising an MOS structure having a series of source regions and drain regions wherein each source region is separated from a drain region by a gate electrode formed on said semicomductor sabstrate and a channel region in said substrate formed below said gate electrode; and
   c) a guard ring and a field oxide surrounding said driver section, said guard ring having a width ranging from about 4 $\mu$m to about 8 $\mu$m;
   wherein said width of said ESD protection device equals the sum of said length of said adjoining driver section plus twice the width of said guard ring and twice the width of said field oxide.

7. A process for forming an integrated circuit structure on a semiconductor substrate capable of providing protection against electrostatic discharge (ESD) and protection against latchup by the structure used to provide said ESD protection comprising the steps of:
   a) forming an ESD protection device;
   b) forming an adjoining driver section with a length dimension facing a width dimension of said ESD protection device; and
   c) surrounding said driver section with a guard ring and a field oxide;
   wherein said width of said ESD protection device equals the sum of said length of said adjoining driver section plus twice the width of said guard ring and twice the width of said field oxide.

* * * * *